United States Patent
Jang

[19]

[11] Patent Number: 6,137,691
[45] Date of Patent: Oct. 24, 2000

[54] THREE DIMENSIONAL COMPOSITE CIRCUIT BOARD

[75] Inventor: Kyung-Woo Jang, Kyungki-do, Rep. of Korea

[73] Assignee: Samsung Electronics Co., Ltd., Kyungki-Do, Rep. of Korea

[21] Appl. No.: 09/150,897

[22] Filed: Sep. 10, 1998

[30] Foreign Application Priority Data

Oct. 10, 1997 [KR] Rep. of Korea ............... 97-52014

[51] Int. Cl.⁷ .................................................. H05K 1/14
[52] U.S. Cl. ..................... 361/784; 361/749; 361/803; 361/807; 174/250; 174/254; 174/255; 257/668; 257/620; 257/723
[58] Field of Search ................................ 361/784, 748, 361/749, 803, 807; 174/250, 254, 255; 257/668, 620, 723; 264/241, 242

[56] References Cited

U.S. PATENT DOCUMENTS

| | | | |
|---|---|---|---|
| 4,727,410 | 2/1988 | Higgins, III | 257/700 |
| 4,801,992 | 1/1989 | Golubic | 257/668 |
| 4,833,568 | 5/1989 | Berhold | 361/690 |
| 4,928,206 | 5/1990 | Porter et al. | 361/699 |
| 5,008,496 | 4/1991 | Schmidt et al. | 174/254 |
| 5,220,488 | 6/1993 | Denes | 361/749 |
| 5,691,885 | 11/1997 | Ward et al. | 361/735 |
| 5,986,886 | 11/1999 | Sasov | 361/704 |
| 6,061,245 | 5/2000 | Ingraham et al. | 361/749 |

FOREIGN PATENT DOCUMENTS

| | | | |
|---|---|---|---|
| 61-17789 | 2/1986 | Japan | H05K 7/14 |
| 62-25276 | 6/1987 | Japan | H05K 1/02 |
| 7-38240 | 2/1995 | Japan | H05K 3/28 |

*Primary Examiner*—Jeffrey Gaffin
*Assistant Examiner*—David Foster
*Attorney, Agent, or Firm*—Sughrue, Mion, Zinn, Macpeak & Seas, PLLC

[57] ABSTRACT

A three dimensional composite circuit board includes a first, second, and third circuit boards and a molding material. The first, second and third circuit board have a plurality of plates which are each folded in order to form a separate cubic shape. The second circuit board has a volume smaller than a volume of the first circuit board so as to be accommodated in the first circuit board, and is coupled to the first circuit board. The third circuit board has a volume smaller than the volume of the second circuit board so as to be accommodated in the second circuit board, and is coupled to the second circuit board. The molding material coats electronic elements which are mounted in the first, second and third circuit boards and brazing portions of the electronic elements to shield the electromagnetic waves generated by the electronic elements. This structure saves installation time required for installing the circuit boards to the appliance, miniaturizes the overall size of the appliance, and reduces cost by re-using the circuit boards which are not damaged. Moreover, the microwave generated from the electronic elements is shielded so that malfunctions of the appliance and harmful effects to human beings can be reduced.

8 Claims, 12 Drawing Sheets

THREE DIMENSIONAL COMPOSITE CIRCUIT BOARD

BACKGROUND OF THE INVENTION

1. Field of the Invention

The present invention relates to a three dimensional composite circuit board, and more particularly, to a box shaped composite circuit board which is manufactured by assembling circuit boards or circuit modules having electronic elements therein, thereby miniaturizing the size of an appliance which contains the circuit board.

2. Description of the Prior Art

Generally, a circuit board used in an electric, an electronic or a telecommunication appliance is made of plastic and has a molding surface thereon. The circuit board is provided thereon with a circuit pattern such as a constant-voltage regulating circuit, an amplifying circuit, an oscillation circuit or a synchronizing circuit. The upper surface of the circuit pattern is coated with a non-electrolysis plating. In addition, various electronic elements such as a transistor, a diode, an IC, and an LSI are systematically mounted in the circuit board in accordance with the circuit pattern.

The circuit boards are piled up in a plurality of layers when they are installed in the appliances. A separate device for installing the circuit board into the appliance is required.

However, such a circuit board is generally manufactured to have a two dimensional shape. Accordingly, when a complex circuit pattern is printed in the circuit board, the circuit board requires a large size, so it is difficult to miniaturize the appliance.

In addition, a substantial amount of labor is required to install the circuit board into the appliance. Also, since the circuit boards installed in the appliance should be interconnected with each other, all circuit boards are replaced even when only one of them is faulty, thus causing the repair and replacement cost to be high.

In order to solve the above problems, many improved circuit boards have been proposed. For example, Japanese Patent Laid-open No. 04-208587 discloses a three dimensional circuit module. According to the three dimensional circuit module, a flexible board having electronic elements therein is manufactured as a polyhedral shape, and has a multi-layered structure. A molding material is coated on one side of the flexible circuit board.

However, it is difficult to manufacture the flexible circuit board having the multi-layered structure. In addition, a large space in the appliance is required in order to install the multi-layered flexible circuit boards, so it is difficult to miniaturize the appliance. Furthermore, since the flexible circuit board has a cubic shape, it is impossible to re-use the circuit board which forms the other sides even when a circuit board forming only one side of the cubic is faulty.

In addition, not only is a fixing device for fixing the flexible circuit boards to the appliance required, but also an electromagnetic wave generated from the electronic elements in the flexible circuit board is not shielded, so that the electromagnetic waves may cause the appliance to malfunction and may harm the user.

SUMMARY OF THE INVENTION

The present invention has been made to overcome the above described problems of the prior art, and accordingly it is an object of the present invention to provide a three dimensional composite circuit board which has a polyhedral shape and in which a plurality of circuit boards having gradually smaller volumes are sequentially inserted into spaces of the circuit boards, thereby saving the time required for installing the circuit boards to the appliance, miniaturizing the size of the appliance and reducing cost by re-using the circuit boards which are not damaged.

Another object of the present invention is to provide a three dimensional composite circuit board in which a molding material is coated on the circuit board in such a manner that electronic elements provided in the circuit boards and brazing portion of the electronic elements are coated by the molding material, thereby shielding the electromagnetic waves from the electronic elements and reducing the malfunction of the appliance.

To achieve these objectives, the present invention provides a three dimensional composite circuit board comprising a first, second, and third circuit board and a molding material.

The first, second and third circuit board have a plurality of plates which are folded for forming respective cubic shapes.

The second circuit board has a volume smaller than a volume of the first circuit board so as to be accommodated in the first circuit board, and is coupled to the first circuit board. The third circuit board has a volume smaller than the volume of the second circuit board so as to be accommodated in the second circuit board, and is coupled to the second circuit board.

The molding material coats electronic elements which are mounted in the first, second and third circuit boards and brazing portions of the electronic elements to shield the electromagnetic waves from the electronic elements.

According to another aspect of the present invention, a three dimensional composite circuit board comprises a first circuit board, a second circuit board to be coupled to an upper portion of the first circuit board, and a third circuit board to be coupled to an upper portion of the second circuit board.

The first circuit board has a plurality of plates which are folded, first sliders which have first grooves and are inwardly protruded at an upper plate section thereof, and fixing portions for securing the first circuit board to a casing of an appliance.

The second circuit board has a plurality of plates which are folded, second sliders which are outwardly protruded at a lower plate section thereof and slidably coupled to the first grooves of the first circuit board, and third sliders which are inwardly protruded at an upper plate section thereof and have second grooves.

The third circuit board has a plurality of plates which are folded, and fourth sliders which are inwardly protruded at a lower plate section thereof and slidably coupled to the second grooves.

The three dimensional composite circuit board according to the present invention has advantages that the time required for installing the circuit boards to the appliance can be shortened, the size of the appliance can be miniaturized, and the waste incurred in conventional devices can be reduced by re-using the circuit boards which are not damaged.

Moreover, the three dimensional composite circuit board according to the present invention shields the electromagnetic waves from the electronic elements so that malfunctioning of the appliance and harm to human beings can be minimized.

BRIEF DESCRIPTION OF THE DRAWINGS

The above object and other advantages of the present invention will become more apparent by describing in detail a preferred embodiment thereof with reference to the attached drawings, in which:

FIG. 4b is an enlarged sectional view of the portion A in FIG. 4a;

FIG. 8b is an enlarged sectional view of the portion B in FIG. 8a; and

FIG. 8c is an enlarged sectional view of the portion C in FIG. 8a.

DETAILED DESCRIPTION OF THE PREFERRED EMBODIMENTS

FIGS. 1 to 4 show the three dimensional composite circuit board of the present invention. The three dimensional composite circuit board is manufactured by a first circuit board 10 which is formed as a plate by injection molding a plastic. First circuit board 10 has three bending portions so as to have a box shape. When it is developed, first circuit board 10 is divided into A, B, C, and D plate sections which each have the same size. A fixing portion 11 extends from one side of the A and C plate sections, for securing first circuit board 10 to an interior of an electric or an electronic appliance.

Figure 1:
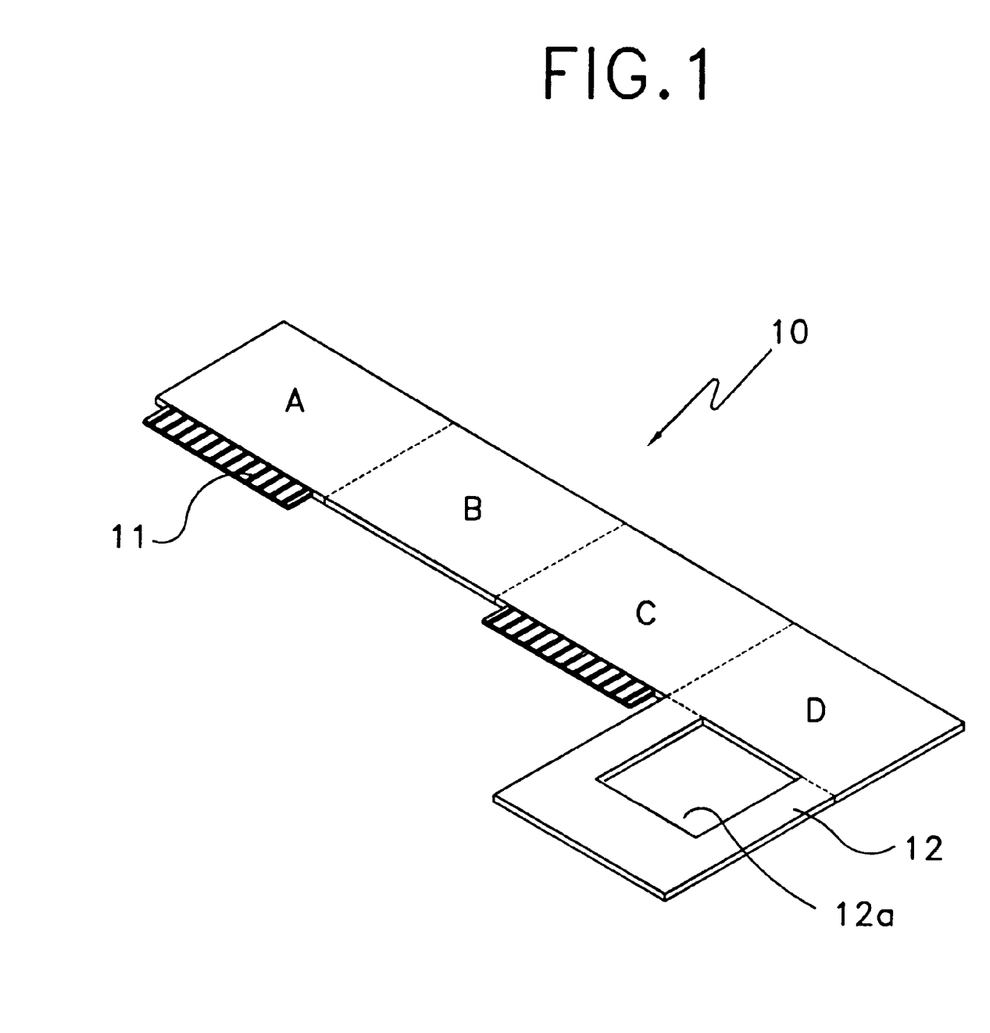
FIG. 1 is a development view showing a three dimensional composite circuit board according to the present invention.
Figure 2:
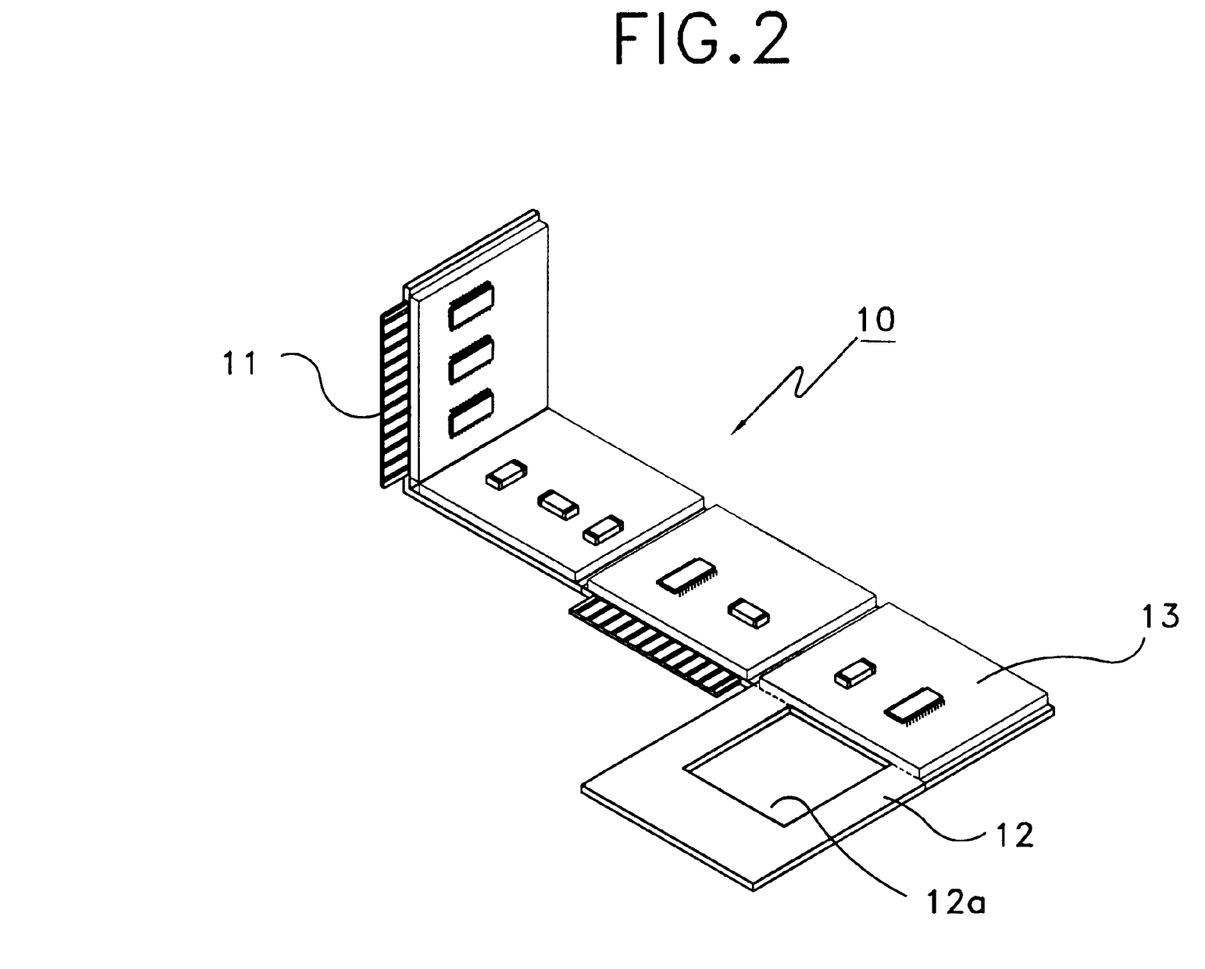
FIG. 2 is a perspective view showing electronic elements mounted in the three dimensional composite circuit board shown in FIG. 1.

At least one of the B and D plate sections is provided with a bottom plate 12 having an opening 12a, and a plurality of electronic elements are mounted on the inner sides of the A to D plate sections. In order to shield an electromagnetic wave from the electronic elements, first circuit board 10 is coated with a molding material 13 in such a manner that the electronic elements and brazing portions are coated with molding material 13.

The A plate section is adhered to the D plate section and bottom plate 12 to the A, B, and C plate sections respectively by means of an adhesive. In addition, it is also possible to fit bottom plate 12 to the A, B, and C plate sections and the A plate section to the D plate section by providing coupling pins and coupling holes to the contact portions between bottom plate 12 and the A, B, and C plate sections, and between the A plate section and the D plate section.

Fixing portion 11 is a terminal or a pin which is inserted into a slot (not shown) formed in a case (not shown) of the appliance.

Molding material 13 is coated on both inner and outer surfaces of the A to D plate sections so as to allow first circuit board 10 to be simply folded into the box shape.

Figure 3:
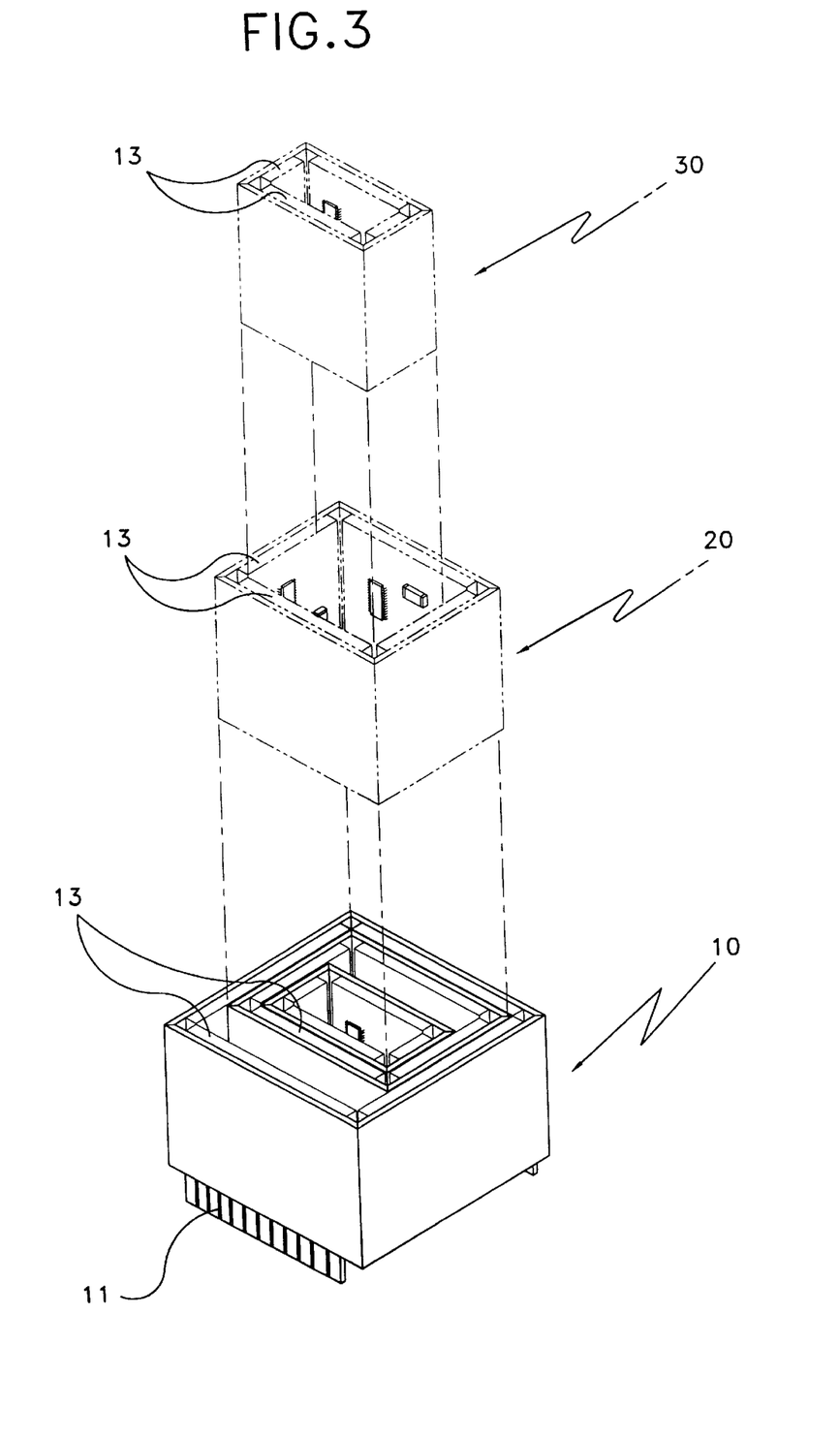
FIG. 3 is a perspective view showing a plurality of the three dimensional composite circuit board assembled to each other.
Figure 4A:
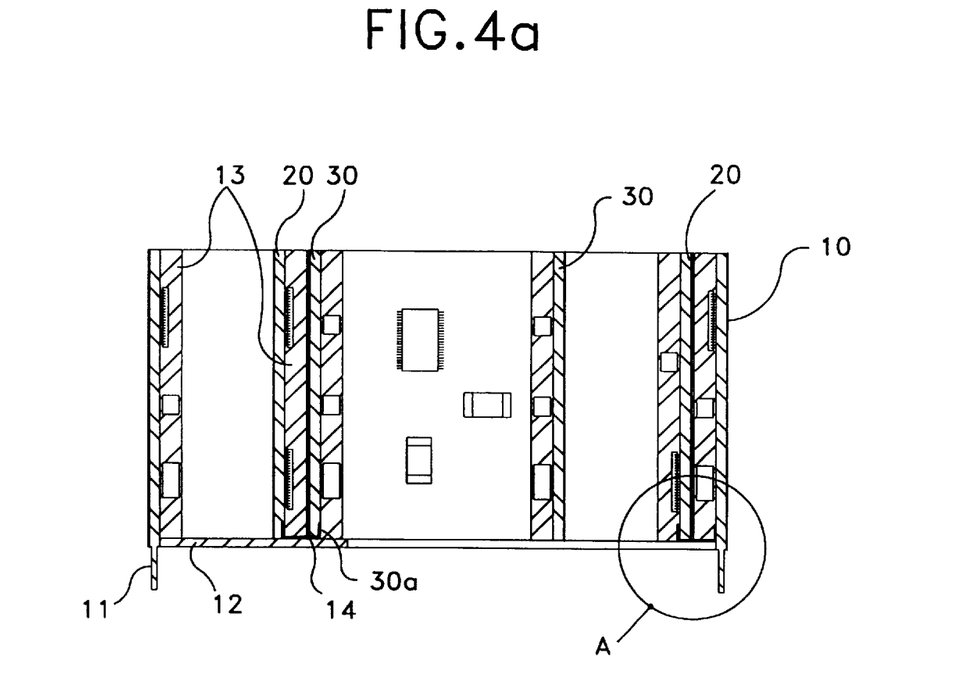
FIG. 4a is a sectional view showing terminal sections of the three dimensional composite circuit board connected to each other.
Figure 4B:
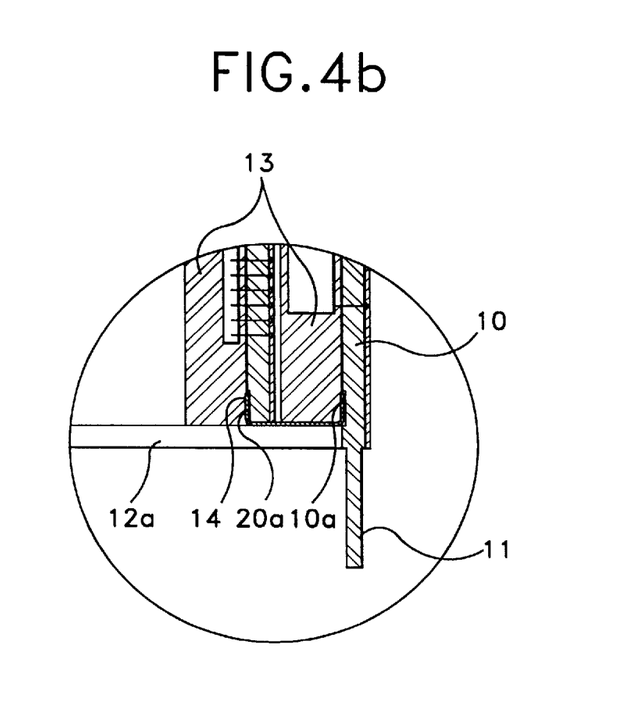

The electronic elements are mounted on inner surfaces of the A to D plate sections, before first circuit board 10 is folded into a polyhedral shape as shown in FIGS. 3 to 4b, by adhering the A plate section to the D plate section and bottom plate 12 to the A, B, and C plate sections respectively. At this time, an electronic element generating a great amount of heat is preferably disposed at a lower portion of first circuit board 10.

In an inner space of first circuit board 10, several circuit boards are sequentially inserted, such as a second circuit board 20 and a third circuit board 30 which are manufactured in the same manner as first circuit board 10. At this time, the volume of first circuit board 10 is larger than that of second circuit board 20, and the volume of second circuit board 20 is larger than that of third circuit board 30. In addition, as shown in FIGS. 4a and 4b, terminal portions 10a, 20a and 30a of first, second and third circuit boards 10, 20, and 30 are connected to each other through a flexible board 14.

Second circuit board 20 is coupled to first circuit board 10 in such a manner that a space is formed between first and second circuit boards 10 and 20. The heat generated from the electronic elements provided in first and second circuit boards 10 and 20 is exhausted out of the exterior through the space. Third circuit board 30 is also coupled to second circuit board 20 in such a manner that a space is formed between second and third circuit boards 20 and 30.

Accordingly, by securing fixing portion 11 formed at the A and C plate sections of first circuit board 10 to the case of the appliance, in which second and third circuit boards are installed to the space therein, the space required for installing the circuit boards in the appliance is reduced so that the overall size of the appliance can be miniaturized.

In addition, when one of the first to third circuit boards 10, 20 and 30 needs to be replaced, the user can easily pick up the faulty circuit board through an opening 12a of the bottom plate 12 without having to remove the other circuit boards.

FIGS. 5a to 8c show a three dimensional composite circuit board according to another embodiment of the present invention. As shown in the FIG. 5a, the three dimensional composite circuit board is manufactured by a first circuit board 40 having three bending portions so as to form a box shape. When it is developed, first circuit board 40 is divided into E, F, G, and H plate sections, wherein the E plate section has the same size to the G plate section and the F plate section has the same size to the H plate section.

Figure 5A:
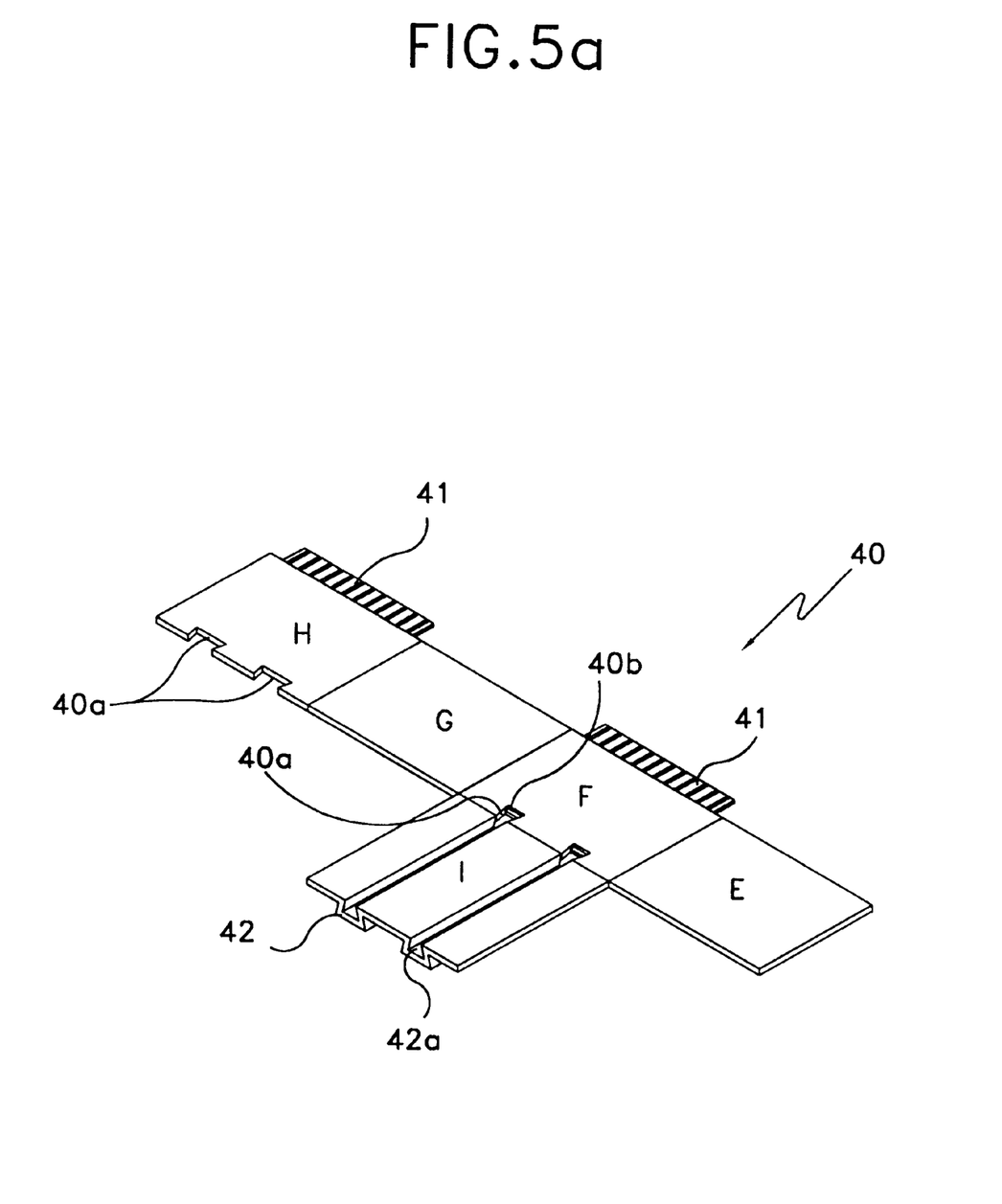
FIGS. 5a to 5c are development views showing three dimensional composite circuit boards according to another embodiment of the present invention.

The F and H plate sections have a fixing portion 41 at one side thereof for securing first circuit board 40 to an interior of an electric or an electronic appliance. The F and H plate sections have first engagement holes 40a and first locking holes 40b formed at one side thereof for communicating with first engagement holes 40a.

The F plate section is provided with an I plate section which can be bent. The I plate section is integrally formed with first sliders 42 having first grooves 42a which are communicated with the first engagement holes 40a of the F and H plate sections. First circuit board 40 is coupled to a second circuit board 50 shown in FIG. 5b.

Figure 5B:
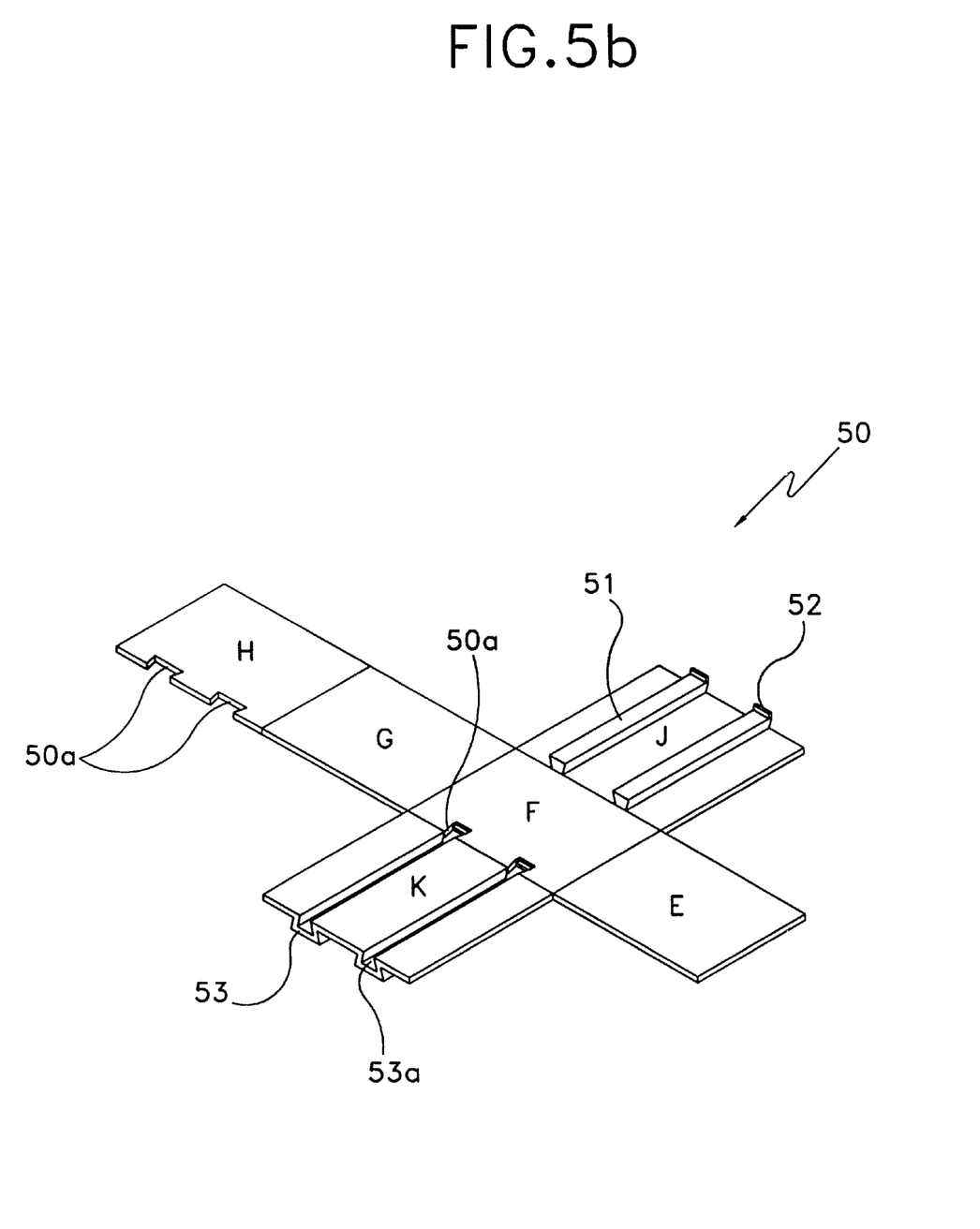

Second circuit board 50 has the same structure as first circuit board 40. Second circuit board 50 has three bending portions and is divided into E, F, G, and H plate sections when it is developed. At both sides of the F plate section, there are respectively provided a J plate section and a K plate section which can be bent. Second sliders 51, which are slidably inserted into first grooves 42a of the I plate section, protrude from an outside of the J plate section.

Installed at end portions of second sliders 51 are first locking jaws 52 which are inserted into first locking holes 40b of the F plate section of first circuit board 40 for preventing second circuit board 50 from separating from first circuit board 40.

Figure 5C:
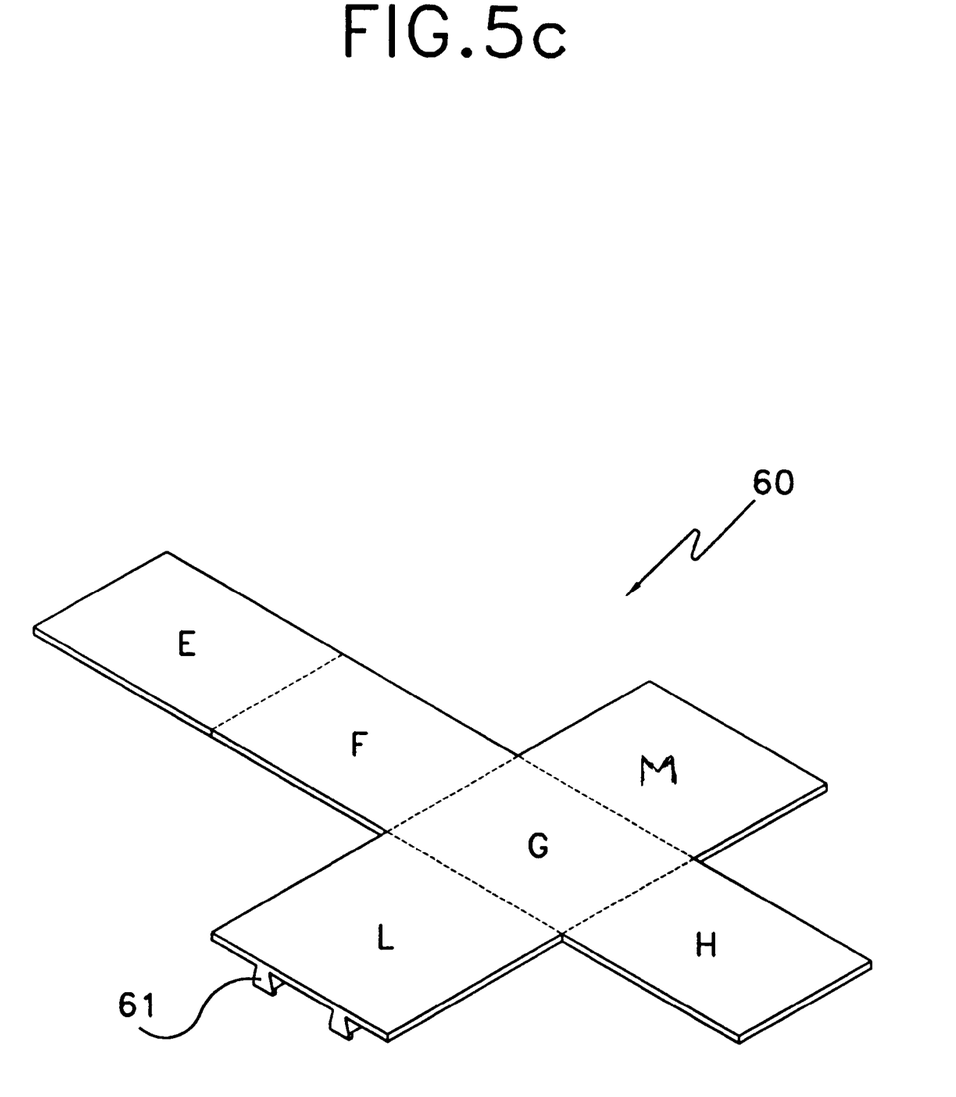

The K plate section of second circuit board 50 is integrally formed with third sliders having second grooves 53a. Third sliders 53 are communicated with second engagement holes 50a of the F and H plate sections. A third circuit board 60 shown in FIG. 5c is engaged with second grooves 53a.

Third circuit board 60 has the same structure as first and second circuit boards 40 and 50. Third circuit board 60 has three bending portions and is divided into E, F, G, and H plate sections when it is developed. At one side of the G plate section, there is provided a L plate section which can be bent. At the opposite side of the G plate section, an M plate section is provided. Fourth sliders 61, which are slidably inserted into second grooves 53a of third sliders 53 formed at the K plate section of second circuit board 50, protrude from the L plate section.

Figure 6A:
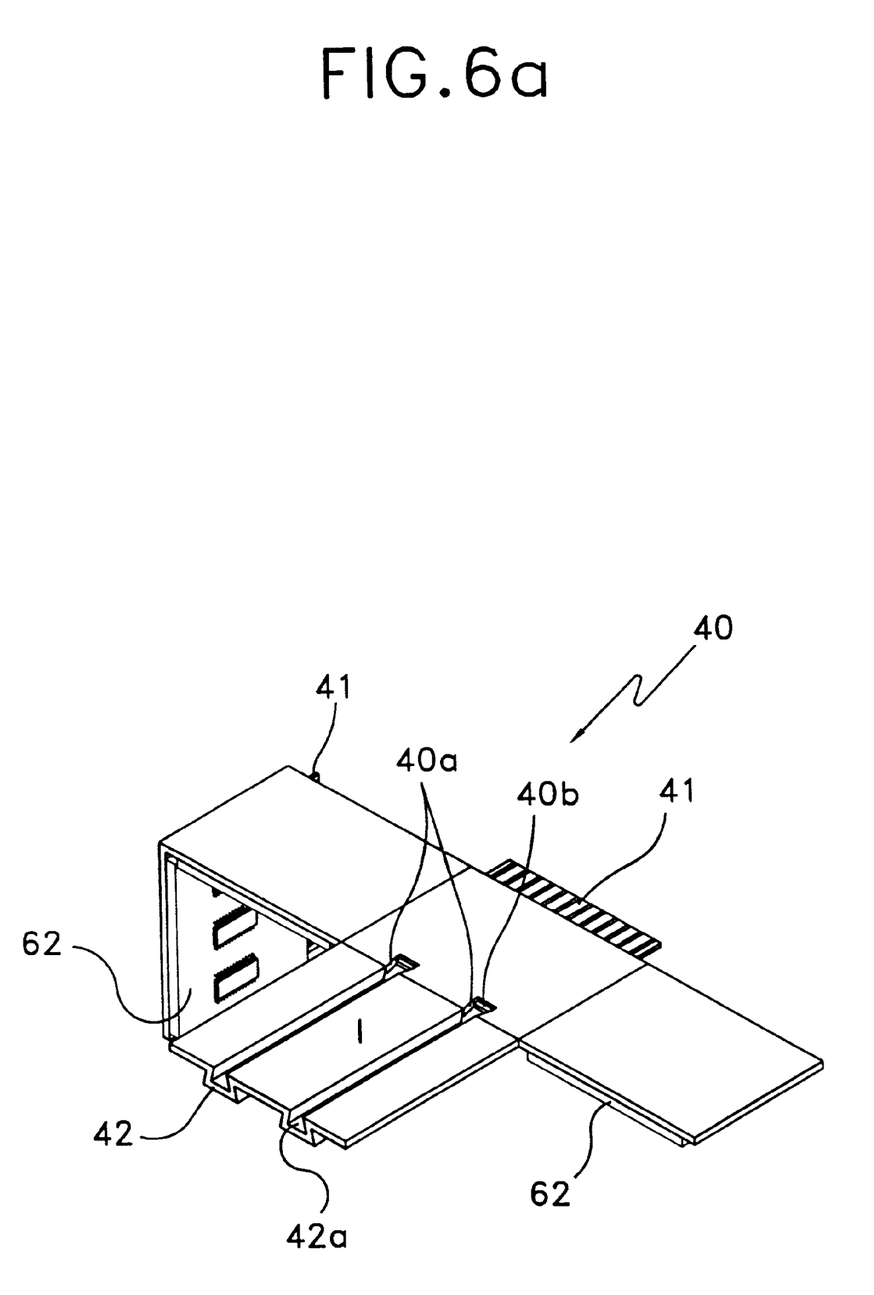
FIGS. 6a to 6c are perspective views showing electronic elements mounted in the three dimensional composite circuit board according to another embodiment of the present invention.
Figure 6B:
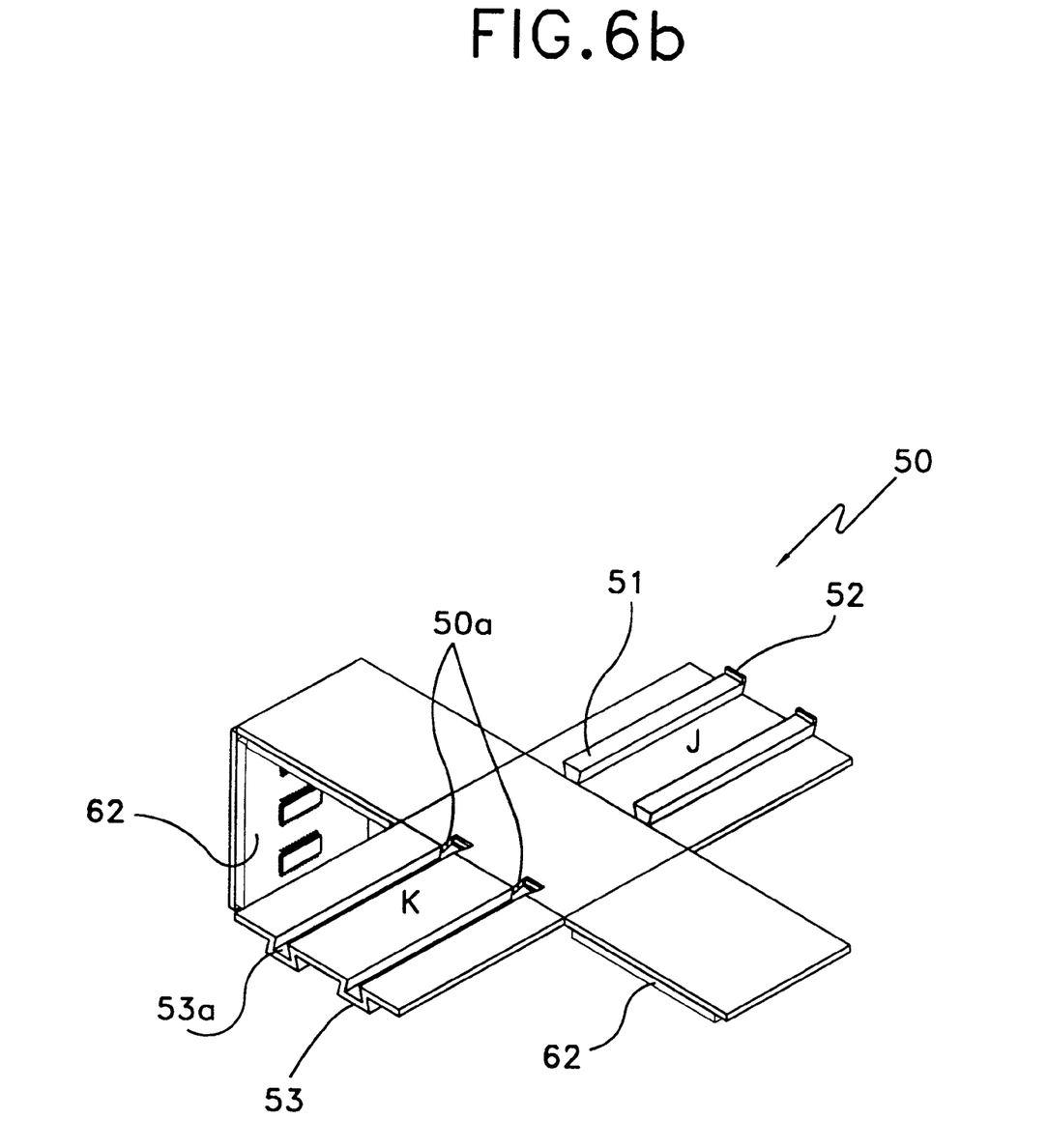
Figure 6C:
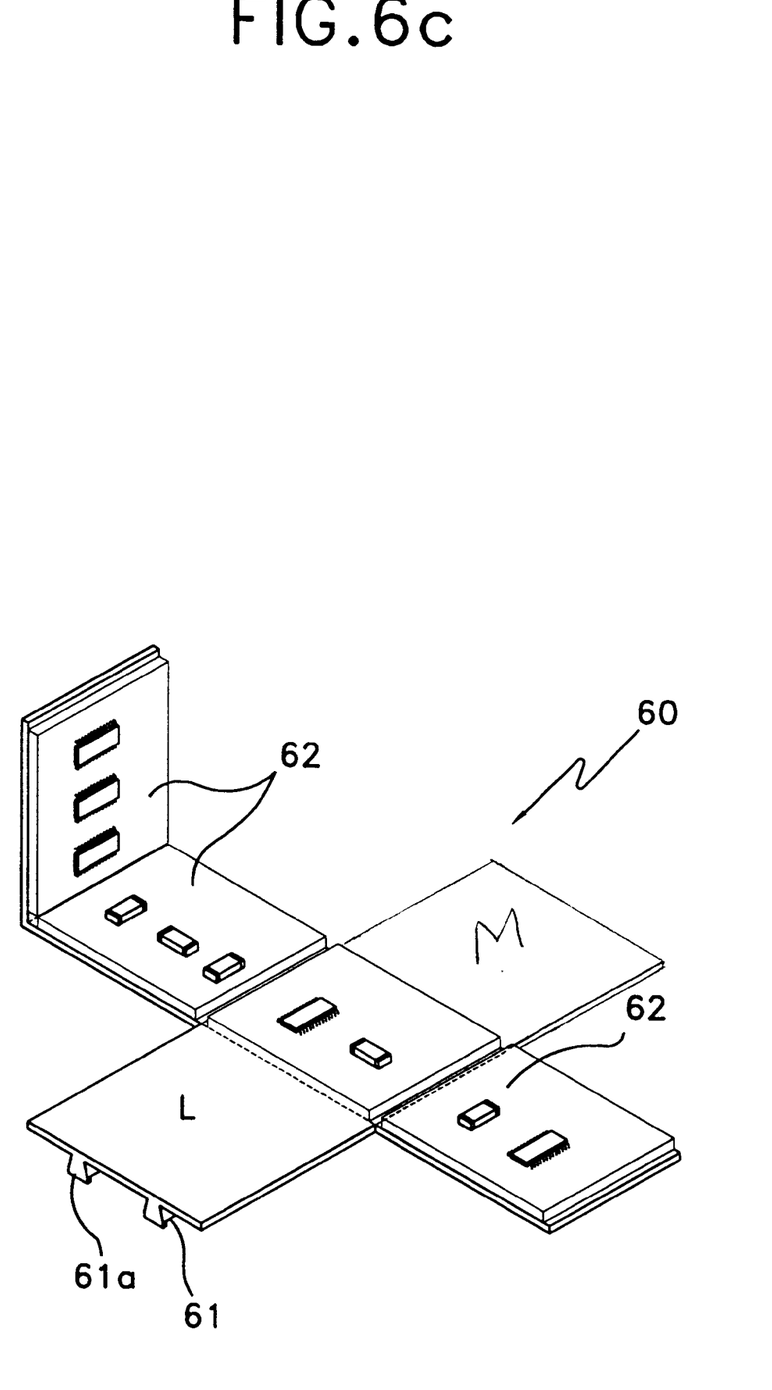

As shown in FIGS. 6a to 6c, a plurality of electronic elements are provided at inner sides of first, second and third circuit board 40, 50, and 60. In order to shield an electromagnetic wave from the electronic elements, first, second and third circuit boards 40, 50, and 60 are coated with a molding material 62 in such a manner that the electronic elements and brazing portions can be coated with molding material 62, thereby reducing the negative effects of electromagnetic waves.

Electronic elements are provided at the E, F, G, and H plate sections of first, second and third circuit boards 40, 50, and 60. Since the electronic elements and brazing portion of first, second and third circuit boards 40, 50, and 60 are coated with a molding material 62, negative effects from the electromagnetic wave can be reduced. In order to allow first, second and third circuit boards 40, 50, and 60 to have a three dimensional box shape, the I, J, K, L and M plate sections are adhered to the E and H plate sections after adhering the E and H plate sections to each other.

Figure 7:
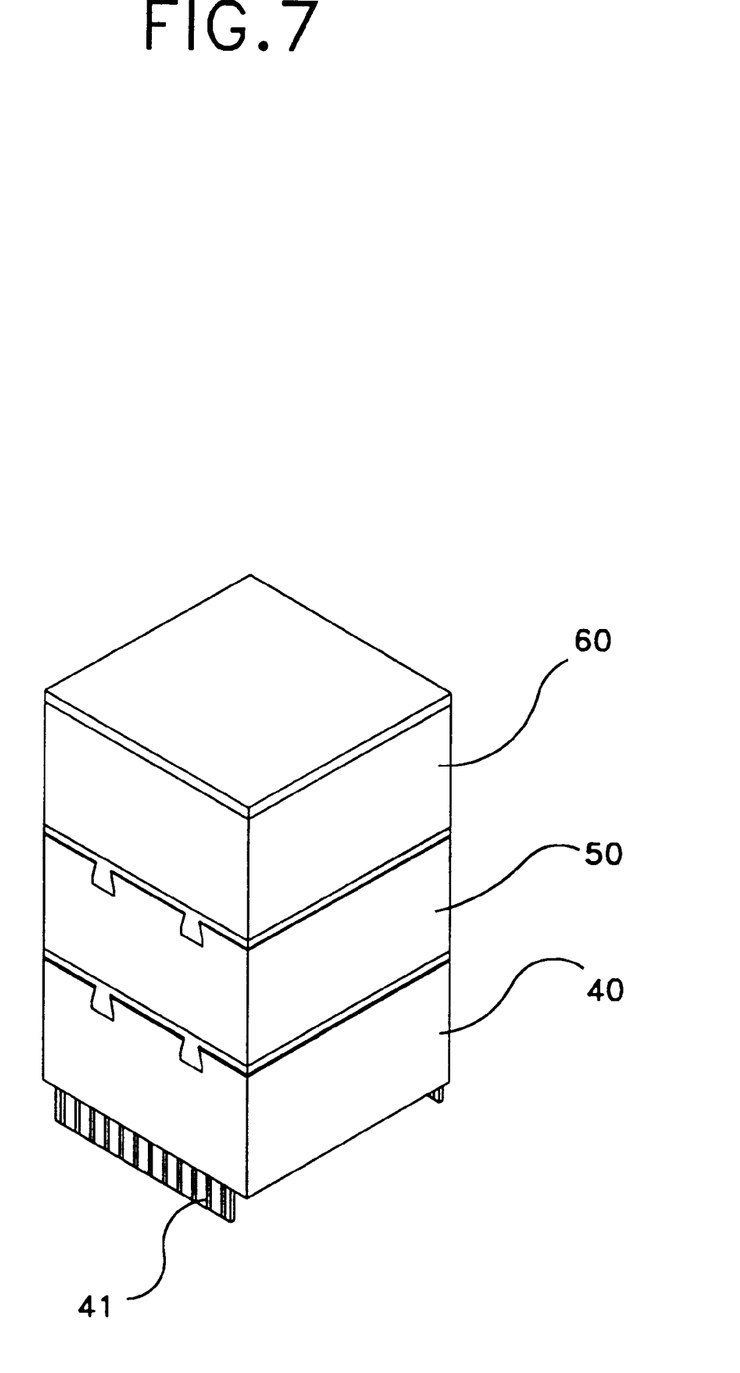
FIG. 7 is an assembling view of the three dimensional composite circuit boards according to the present invention.

Second circuit board 50 is assembled onto an upper portion of first circuit board 40, and third circuit board 60 is assembled onto an upper portion of second circuit board 40, thereby making the three dimensional composite circuit board as shown in FIG. 7. Second circuit board 50 is assembled to the upper portion of first circuit board 40 by slidably inserting sliders 51 provided at the J plate section of second circuit board 50 into first grooves 42a formed at the I plate section of first circuit board 40.

Figure 8A:
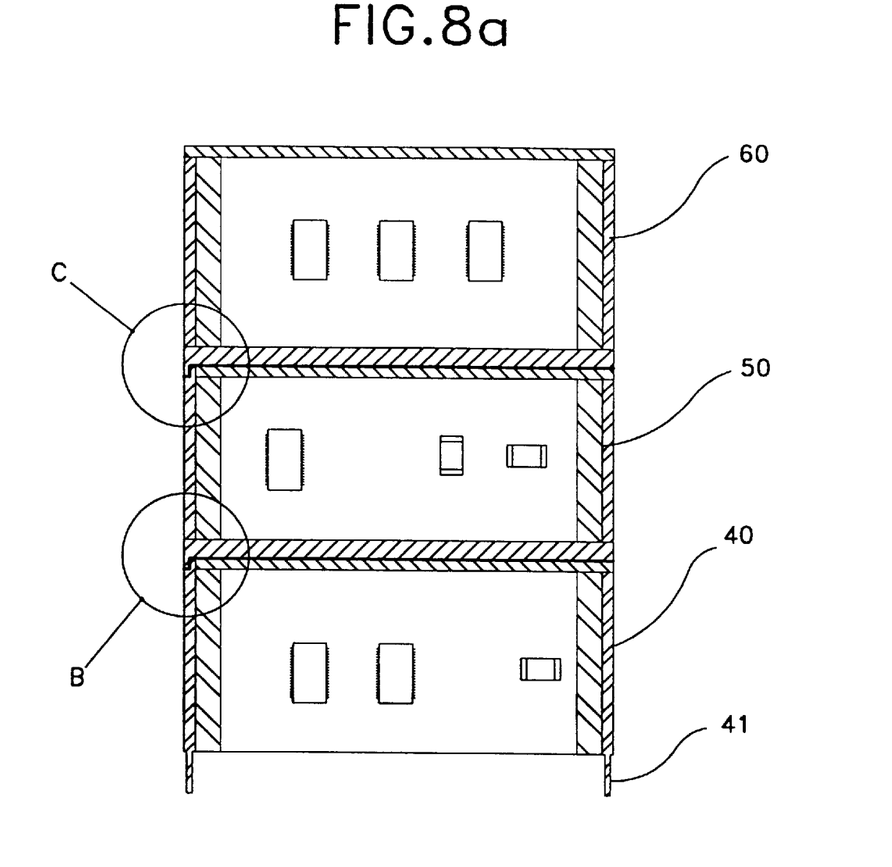
FIG. 8a is a sectional view showing an assembled the three dimensional composite circuit board shown in FIG. 7.
Figure 8B:
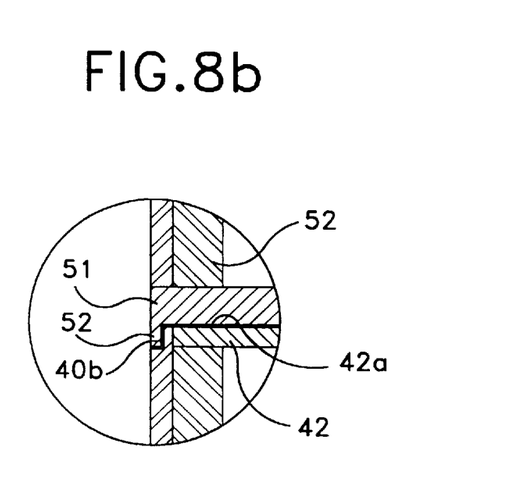
Figure 8C:
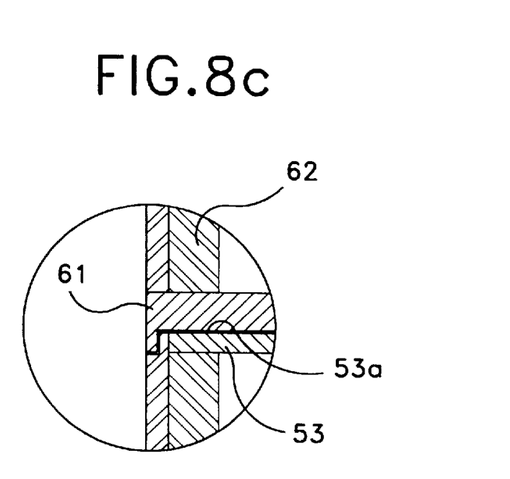

At this time, first locking jaws 52, which are extended from first slider 51 of second circuit board 50, are inserted into and locked by first locking holes 40b of the F plate section of first circuit board 40, thereby preventing second circuit board 50 from separating from first circuit board 40. In addition, third circuit board 60 is assembled to the upper portion of second circuit board 50 by slidably inserting fourth sliders 61 provided at the L plate section of third circuit board 60 into second grooves 53a formed at the K plate section of second circuit board 50, so that the three dimensional composite circuit board is assembled as shown in FIGS. 7 to 8c. In this state, terminal portions of first, second and third circuit boards 40, 50, and 60 are coupled to each other, and fixing portions 41 formed at the F and H plate sections of first circuit board 40 are secured to the case of the appliance, so the space required for installing the circuit boards into the appliance can be minimized.

Though the three dimensional composite circuit board is described as a rectangular circuit board installed in the case of the electronic appliance, it is also possible to make the three dimensional composite circuit board as a polyhedron circuit board. In this case, the polyhedron circuit board can be used as a wireless peripheral equipment separated from the case of the electronic appliance.

While the present invention has been particularly shown and described with reference to the preferred embodiment thereof, it will be understood by those skilled in the art that various changes in form and details may be effected therein without departing from the spirit and scope of the invention as defined by the appended claims.

What is claimed is:

1. A three dimensional composite circuit board comprising:
   a first circuit board having a plurality of plates which fold to form a cubic shape;
   a second circuit board having a volume smaller than a volume of said first circuit board so as to be accommodated in said first circuit board, said second circuit board being coupled to said first circuit board;
   a third circuit board having a volume smaller than the volume of said second circuit board so as to be accommodated in said second circuit board, said third circuit board being coupled to said second circuit board; and
   a molding material for coating electronic elements mounted in said first, second and third circuit boards and brazing portions thereof so as to shield electromagnetic waves from the electronic elements.

2. The three dimensional composite circuit board as claimed in claim 1, wherein said first circuit board to which said second and third circuit boards are coupled has fixing portions for securing said first circuit board to an interior of a case of an appliance.

3. The three dimensional composite circuit board as claimed in claim 1, wherein said first, second and third circuit boards coupled to each other are used as a peripheral equipment which is separated from a case of an electronic appliance and is electrically connected to the electronic appliance by means of a connecting member.

4. The three dimensional composite circuit board as claimed in claim 1, wherein said first circuit board is provided at one side thereof with a bottom plate having an opening for separating said second circuit board or said third circuit board from said first circuit board.

5. The three dimensional composite circuit board as claimed in claim 1, wherein said second circuit board is coupled to said first circuit board in such a manner that a first space is formed between said first and second circuit boards, and said third circuit board is coupled to said second circuit board in such a manner that a second space is formed between said second and third circuit boards, so that heat generated from the electronic elements is exhausted out of an exterior through the first and second spaces.

6. A three dimensional composite circuit board comprising:
   a first circuit board having plurality of plates which fold to form a cubic shape, first sliders which have first grooves and are inwardly protruded at upper plate section thereof, and fixing portions for securing the first circuit board to a case of an appliance;
   a second circuit board having plurality of plates which are folded for forming a cubic shape, second sliders which are outwardly protruded at lower plate section thereof and slidably coupled to said first grooves of said first circuit board so as to coupled said second circuit board with said first circuit board, and third sliders which are inwardly protruded at an upper plate section thereof and have second grooves; and a third circuit board having plurality of plates which fold to form a cubic shape, and fourth sliders which are inwardly protruded at a lower plate section thereof and slidably coupled to said second grooves.

7. The three dimensional composite circuit board as claimed in claim 6, wherein two plate sections of said first circuit board are formed with first engagement holes, and at least one of the two plate sections of said first circuit board are formed with first locking holes for preventing said second circuit board from separating from said first circuit board, two plate sections of said second circuit board are formed with second engagement holes and at least one of the two plate sections of said second circuit board are formed with second locking holes for preventing said third circuit boards from separating from said second circuit board.

8. The three dimensional composite circuit board as claimed in claim 7, wherein said second and fourth sliders are provided with first and second locking jaws which are coupled to said first and second locking holes, respectively.

* * * * *